(12) United States Patent
Lai et al.

(10) Patent No.: US 11,960,203 B2
(45) Date of Patent: Apr. 16, 2024

(54) METHOD OF FORMING PATTERNS ON SUBSTRATE BY DOUBLE NANOIMPRINT LITHOGRAPHY

(71) Applicant: UNITED MICROELECTRONICS CORP., Hsin-Chu (TW)

(72) Inventors: Yi-Chieh Lai, Nantou County (TW); Chih-Hsien Tang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/749,114

(22) Filed: May 19, 2022

(65) Prior Publication Data

US 2023/0350286 A1 Nov. 2, 2023

(30) Foreign Application Priority Data

Apr. 28, 2022 (TW) ................................. 111116239

(51) Int. Cl.
*G03F 7/00* (2006.01)
*B29C 59/02* (2006.01)

(52) U.S. Cl.
CPC .......... *G03F 7/0002* (2013.01); *B29C 59/022* (2013.01); *B29C 59/026* (2013.01)

(58) Field of Classification Search
CPC .... G03F 7/0002; B29C 59/022; B29C 59/026
See application file for complete search history.

(56) References Cited

U.S. PATENT DOCUMENTS

| | | | |
|---|---|---|---|
| 7,520,742 B2 | 4/2009 | MotoWaki | |
| 7,708,924 B2 | 5/2010 | Kolesnychenko | |
| 8,007,631 B2 * | 8/2011 | Dakshina-Murthy | B82Y 10/00 430/323 |
| 8,795,775 B2 | 8/2014 | Koo | |
| 2010/0230864 A1 | 9/2010 | Park | |
| 2012/0112385 A1 * | 5/2012 | Sreenivasan | G03F 7/0002 264/293 |
| 2016/0314233 A1 * | 10/2016 | Wang | G03F 7/70433 |

OTHER PUBLICATIONS

Tao Deng, Prototyping of Masks, Masters, and Stamps/Molds for Soft Lithography Using an Office Printer and Photographic Reduction, Anal. Chem. 2000, 72, 3176-3180 (Year: 2000).*

* cited by examiner

*Primary Examiner* — Alison L Hindenlang
*Assistant Examiner* — Erica Hartsell Funk
(74) *Attorney, Agent, or Firm* — Winston Hsu

(57) ABSTRACT

A method of forming patterns on a substrate by double nanoimprint processes includes providing a first replicate mold and a second replicate mold. The first replicate mold includes numerous first patterns. The second replicate mold includes at least one second pattern. The second pattern corresponds to at least one of the first patterns. Later, a first substrate is provided. A first polymeric compound layer is coated on the first substrate. Next, the first patterns are nanoimprinted into the first polymeric compound layer. Subsequently, the first substrate is etched by taking the first polymeric compound layer as a mask. After that, a second polymeric compound layer is coated on the first substrate. Later, the second pattern is nanoimprinted into the second polymeric compound layer. Finally, the first substrate is etched by taking the second polymeric compound layer as a mask.

12 Claims, 5 Drawing Sheets

METHOD OF FORMING PATTERNS ON SUBSTRATE BY DOUBLE NANOIMPRINT LITHOGRAPHY

BACKGROUND OF THE INVENTION

1. Field of the Invention

The present invention relates to a method of forming patterns by nanoimprint lithography, and more particularly to a method of forming patterns on a substrate by double nanoimprint processes.

2. Description of the Prior Art

The semiconductor industry continues to strive for greater manufacturing yields while increasing device integrity. Therefore, the development of lithography technology is severely challenged due to physical limitations and manufacture cost. Currently, nanoimprint technology is generally regarded as the most promising nanolithography technology of the next generation, because this technology only needs to make a mold with widths in nanometer scale, and then a large number of desired patterns can be reproduced. The nanoimprint technology has the advantage of mass production, which can make up the shortcomings of the electron beam lithography process which has low production efficiency. Furthermore, equipment of the nanoimprint technology costs less than that of the ultra-deep ultraviolet stepper.

However, since the desired patterns often have different density of distributions, the final patterns formed by the nanoimprint technology often have different critical dimensions comparing to the desired patterns.

SUMMARY OF THE INVENTION

In view of this, a method of forming patterns on a substrate by double nanoimprint processes is provided in the present invention to solve the above-mentioned problem.

According to a preferred embodiment of the present invention, a method of forming patterns on a substrate by double nanoimprint processes includes providing a first replicate mold and a second replicate mold, wherein the first replicate mold includes numerous first patterns, the second replicate mold includes at least one second pattern, and the second pattern corresponds to at least one of the first patterns. Next, a first substrate is provided, and a first polymeric compound layer is coated on the first substrate. Then, a first nanoimprint process is performed to nanoimprint the first patterns into the first polymeric compound layer. After the first nanoimprint process, a first etching process is performed to etch the first substrate by taking the first polymeric compound layer as a first mask. After the first etching process, a second polymeric compound layer is formed to be coated on the first substrate. Subsequently, a second nanoimprint process is performed to nanoimprint the second pattern into the second polymeric compound layer. After the second nanoimprint process, a second etching process is performed to etch the first substrate by taking the second polymeric compound layer as a second mask.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 depict a method of forming patterns on a substrate by double nanoimprint processes according to a preferred embodiment of the present invention, wherein:

FIG. 1 depicts formations of a first mold and a second mold;

FIG. 2 is a fabricating stage following from FIG. 1;

FIG. 3 is a fabricating stage following from FIG. 2;

FIG. 4 is a fabricating stage following from FIG. 3;

FIG. 5 is a fabricating stage following from FIG. 4;

FIG. 6 is a fabricating stage following from FIG. 5;

FIG. 7 depicts a fabricating stage of form a first replicate mold; and

FIG. 8 depicts a fabricating stage of form a second replicate mold.

DETAILED DESCRIPTION

FIG. 1 to FIG. 8 depict a method of forming patterns on a substrate by double nanoimprint processes according to a preferred embodiment of the present invention.

Figure 6:
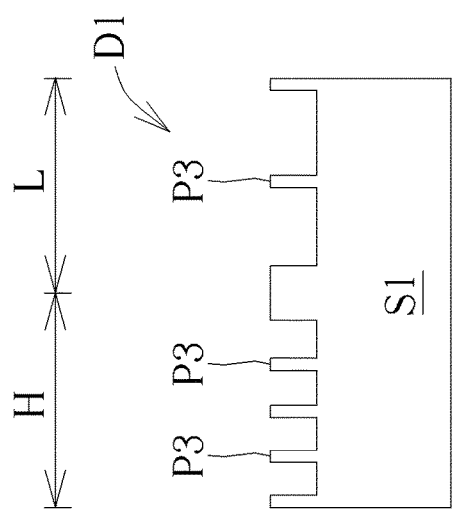

Please refer to FIG. 6. Numerous third patterns P3 on a first substrate S1 form a design pattern D1 which is expected to be formed as a final structure. Each of the third patterns P3 is a protruding feature. However, a density of distribution of the third patterns P3 on the first substrate S1 is not uniform, therefore, the first substrate S1 is defined into a high density region H and a low density region L based on numbers of the third patterns P3. Because the density of distribution of the third patterns P3 on the substrate S1 is different, if the third patterns P3 are formed by imprinting single mold, thicknesses of a residual polymeric compound layer will be different in the high density region H and the low density region L. Different thicknesses of the residual polymeric compound layer lead to different critical dimensions of the third patterns P3 within the high density region H and the low density region L.

Figure 1:
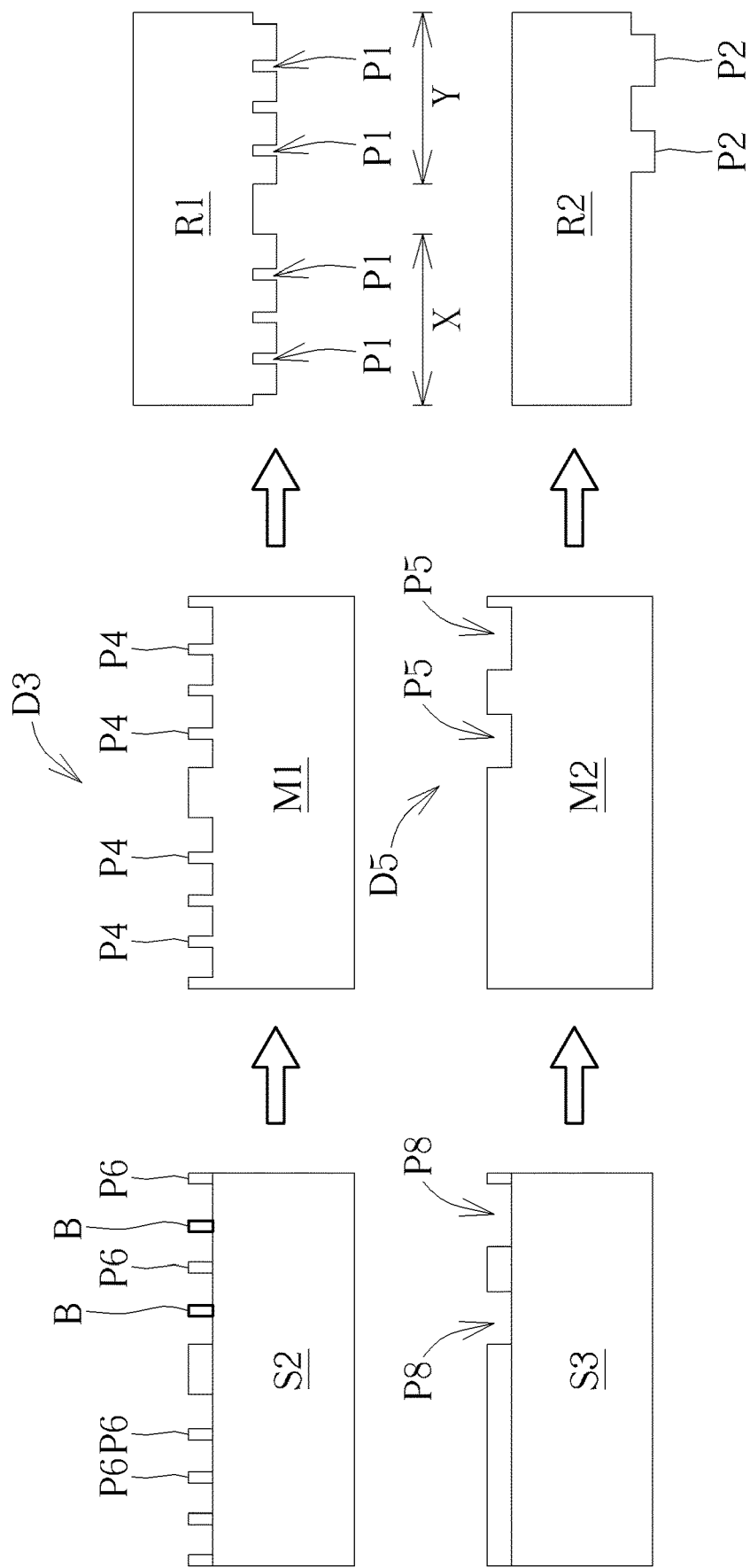

Please refer to FIG. 1 and FIG. 6. In order to solve the problem of different critical dimensions, the design pattern D1 is separated into numerous fourth patterns P4 on a first mold M1 and a fifth pattern P5 on a second mold M2. In the following description, FIG. 1 to FIG. 8 will demonstrate a fabricating method of the present invention.

As shown in FIG. 1, a second substrate S2 is provided. Later, numerous sixth patterns P6 are formed on the second substrate S2. The sixth patterns P6 do not distribute on the second substrate S2 uniformly. Next, at least one balance pattern B is formed within a region where a density of distribution of the sixth patterns P6 is lower comparing to other regions on the second substrate S2. In details, the balance pattern B is disposed between two adjacent sixth patterns P6. Adding the balance pattern B within the region with low density of distribution of the sixth patterns P6 can make the polymeric compound layer flow uniformly at all regions on the second substrate S2. After that, an electron beam lithographic process is performed to etch the second substrate S2 by taking the sixth patterns P6 and the balance pattern B as a mask so as to form the first mold M1. Later, the sixth patterns P6 and the balance pattern B are removed. The first mold M1 includes numerous fourth patterns P4. Similarly, a third substrate S3 is provided. At least one eighth pattern P8 is formed to be embedded within a material layer covering the third substrate S3. The eighth pattern P8 corresponds to the balance pattern B. In details, the eighth pattern P8 is used to locate the balance pattern B. A width of the eighth patterns P8 is smaller than a distance between two adjacent sixth patterns P6 around the balance pattern B. Subsequently, another electron beam lithographic process is performed to etch the third substrate S3 to form the second mold M2 by taking the material layer as a mask. The second mold M2 includes at least one fifth pattern P5. The fifth pattern P5 corresponds to one of the fourth patterns P4. Please refer to FIG. 6 and FIG. 1. The fifth pattern P5 corresponds to the low density region L on the first substrate S1. Moreover, the meaning of the fifth pattern P5 corresponding to the fourth pattern P4 is that the function of the fifth pattern P5 in the fabricating process relates to the position of the correspondent fourth pattern P4. For instance, the fifth pattern P5 locates the pattern imprinted by the fourth pattern P4. The fifth pattern P5 does not locate other patterns except the pattern imprinted by the fourth pattern P4.

Next, the fourth patterns P4 on the first mold M1 are imprinted to a first replicate mold R1 to form numerous first patterns P1 on the first replicate mold R1. The first replicate mold R1 is defined into a first region X and a second region Y. A density of distribution of the first patterns P1 with in the first region X is the same as a density of distribution of the first patterns P1 within the second region Y. The fifth pattern P5 on the second mold M2 is imprinted to a second replicate mold R2 to form at least one second pattern P2. The first patterns P1 and the fourth patterns P4 can engage mutually. Furthermore, the second pattern P2 corresponds to at least one of the first patterns P1. In this embodiment, the first patterns P1 are numerous recessed trenches. The second pattern P2 is a protruding feature. However, based on the final structure, the second pattern P2 and the first patterns P1 can be altered as long as the second pattern P2 is different from each of the first patterns P1. For example, the second pattern P2 can be a recessed trench, and the first patterns P1 can be protruding features. In details, when the first patterns P1 are protruding, the second pattern P2 should be recessed and vice versa. Moreover, the second pattern P2 is designed to locate patterns imprinted by the first patterns P1.

Figure 7:
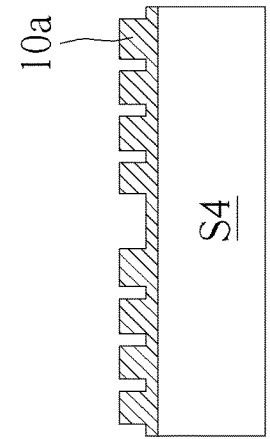
Figure 7:
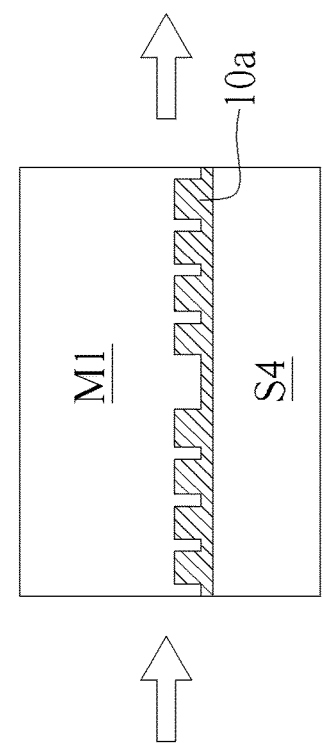
Figure 7:
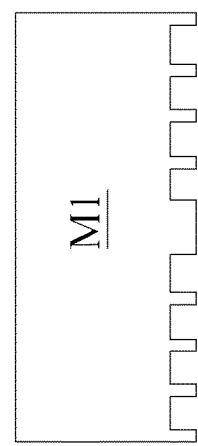
Figure 8:
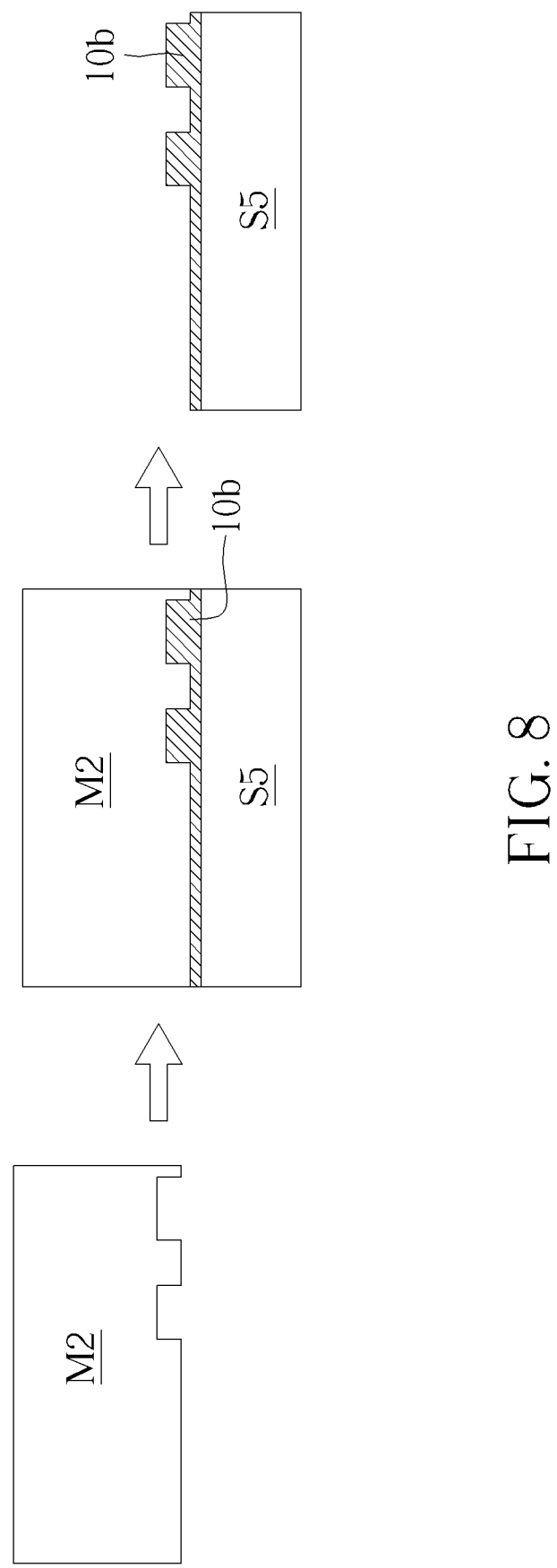

Furthermore, the first replicate mold R1 and the second replicate mold R2 can be formed by nanoimprinting the fourth patterns P4 on the first mold M1 and the fifth pattern P5 on the second mold M2. As shown in FIG. 7, FIG. 8 and FIG. 1, a fourth substrate S4 and a fifth substrate S5 are provided. Polymeric compound layers 10a/10b are respectively formed on the fourth substrate S4 and the fifth substrate S5. Later, the first mold M1 is pressed to the polymeric compound layers 10a on the fourth substrate S4 and the second mold M2 is pressed to the polymeric compound layer 10b on the fifth substrate S5 to make the polymeric compound layer 10a fill up between the fourth substrate S4 and the first mold M1, and the polymeric compound layer 10b fill up the fifth substrate S5 and the second mold M2. Next, the polymeric compound layers 10a/10b are hardened. Later, the first mold M1 and the second mold M2 are removed. Subsequently, the fourth substrate S4 and the fifth substrate S5 are etched by taking the polymeric compound layers 10a/10b as masks to form the first replicate mold R1 and the second replicate mold R2 as shown in FIG. 1.

Figure 2:
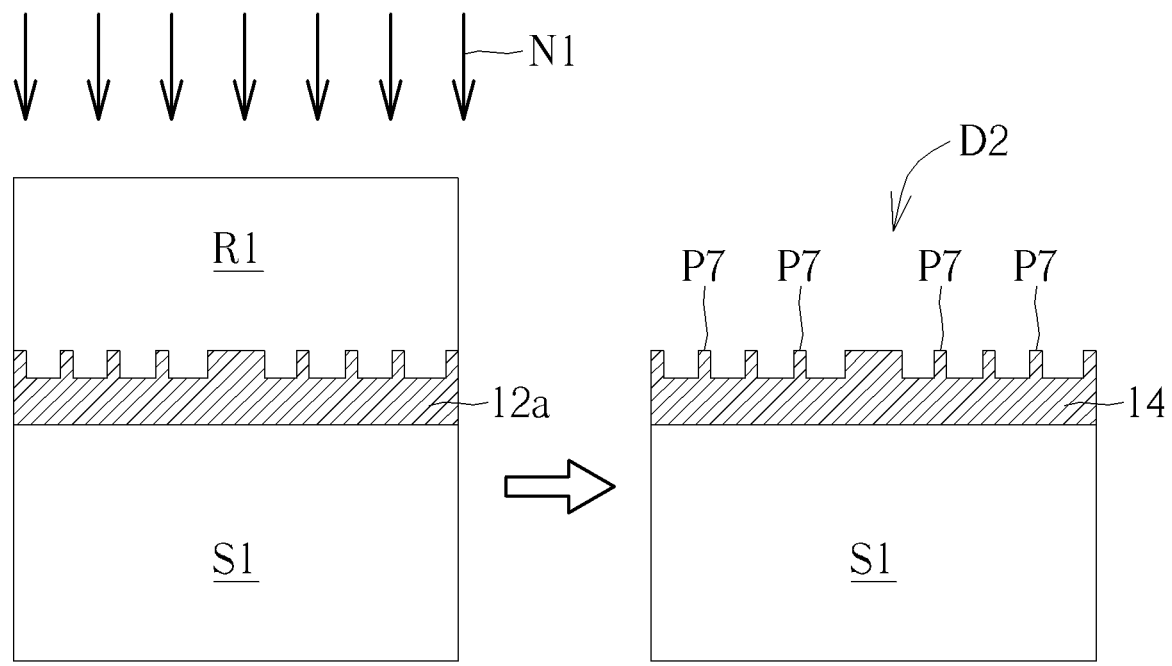

Please refer to FIG. 1 and FIG. 2. A first substrate S1 is pervaded. A first polymeric compound layer 12a is coated on the first substrate S1. Then, a first nanoimprint process N1 is performed to press the first replicate mold R1 to the first substrate S1 to make the first polymeric compound layer 12a fill up between the first substrate S1 and the first replicate mold R1 so as to nanoimprint the first patterns P1 into the first polymeric compound layer 12a. After that, the first polymeric compound layer 12a is hardened. The first polymeric compound layer 12a which is hardened includes numerous seventh patterns P7 and a residual layer 14. The seventh patterns P7 are disposed on the residual layer 14. A size of each of the seventh patterns P7 is the same of a size of each of the fourth patterns P4. Moreover, the seventh patterns P7 form a design pattern D2 on the first polymeric compound layer 12a which is hardened. The design pattern D2 formed by the seventh patterns P7 is the same as the design pattern D3 formed by the fourth patterns P4.

Figure 3:
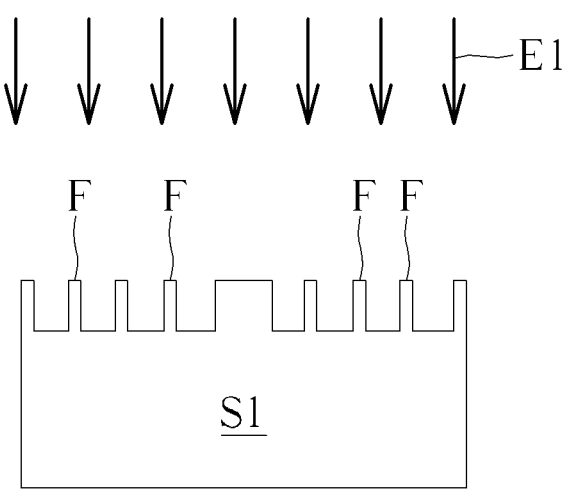
Figure 4:
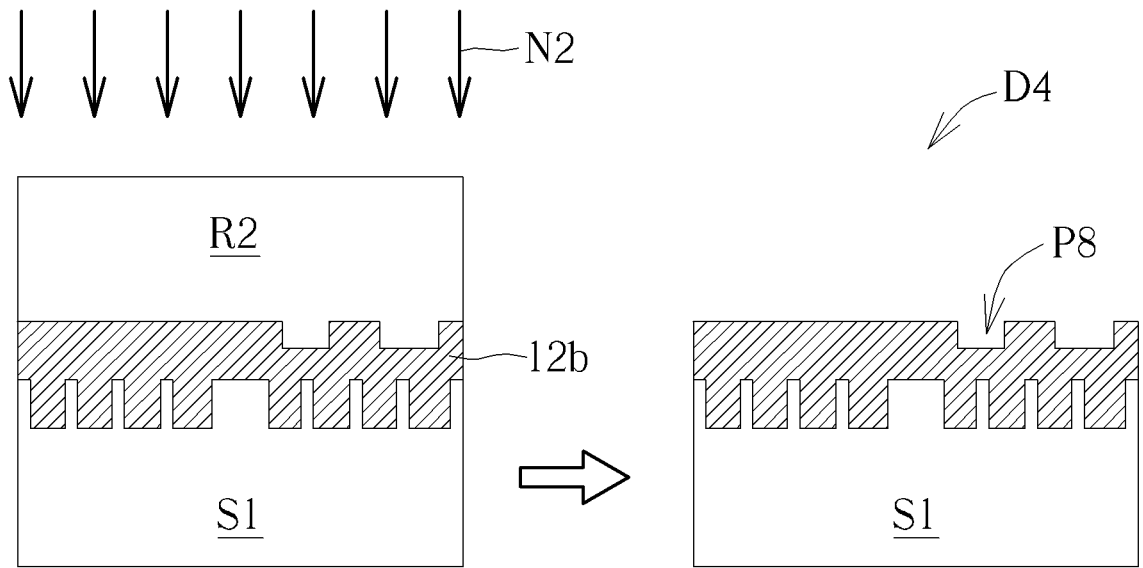

Subsequently, the first replicate mold R1 is removed. As shown in FIG. 1 and FIG. 3, a first etching process E1 is performed. The first substrate S1 is etched to form numerous protruding features F by taking the first polymeric compound layer 12a which is hardened as a mask. The protruding features F are convex relative to the adjacent region. Then, the first polymeric compound layer 12a which is hardened is removed. As shown in FIG. 4, a second polymeric compound layer 12b is formed to be coated on the first substrate S1. The second polymeric compound layer 12b fills between the protruding features F on the first substrate S1 which formed during the first etching process E1. Next, a second nanoimprint process N2 is performed to press the second replicate mold R2 to the first substrate S1 to make the second polymeric compound layer 12b fill up between the first substrate S1 and the second replicate mold R2 so as to nanoimprint the second pattern P2 into the second polymeric compound layer 12b. After that, the second polymeric compound layer 12b is hardened. The second polymeric compound layer 12b which is hardened includes at least one eighth pattern P8. A size of the eighth pattern P8 is the same of a size of the fifth pattern P5. Moreover, the eighth pattern P8 form a design pattern D4 on the second polymeric compound layer 12b is hardened. The design pattern D4 is the same as a design pattern D5 form by the fifth pattern P5. Later, the second replicate mold R2 is removed.

Figure 5:
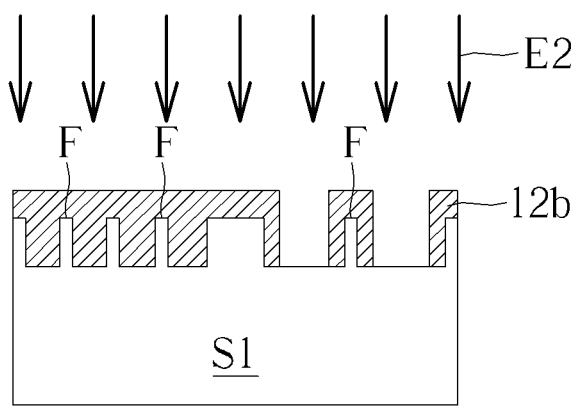

As shown in FIG. 5, a second etching process E2 is performed to etch the first substrate S1 by taking the second polymeric compound layer 12b which is hardened as a mask. During the second etching process E2, at least one of the protruding features F on the first substrate S1 which is at the same column as the eighth pattern P8 will be completely removed. Other protruding features F which are not corresponded to the eighth pattern P8 will be remained. In other words, during the second etching process E2, at least one of the protruding features F is not etched. As shown in FIG. 6, the remaining protruding features F become the third patterns P3, and the second polymeric compound layer 12b which is hardened is removed. Now, the third patterns P3 on the first substrate S1 which is expected to be formed as a final structure is completed.

As shown in FIG. 2, during the first nanoimprint process N1, if the first replicate mold R1 is removed until contacting the first substrate S1, the fabricating process will take too much time in waiting. Therefore, the first replicate mold R1 is removed before contacting the first substrate S1. In this way, the first polymeric compound layer 12a will leave a residual layer 14 on the substrate S1. Because the first patterns P1 on the first replicate mold R1 distributes uniformly, the thickness of the residual layer 14 is uniform as well. Therefore, when the first substrate S1 is etched by taking the first polymeric compound layer 12a as a mask, the aforesaid different critical dimensions of the third patterns P3 can be avoided. On the contrary, if the first substrate S1 is imprinted by a replicate mold having reverse patterns of the third patterns P3, the thicknesses of the residual layer 14 within the high density region H and the low density region will become different. The third patterns P3 formed by etching the first substrate S1 will have different critical dimensions within the high density region H and the low density region L.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming patterns on a substrate by double nanoimprint processes, comprising:
    providing a first replicate mold and a second replicate mold, wherein the first replicate mold is defined into a first region and a second region, the first replicate mold comprises a plurality of first patterns disposed within the first region and the second region, a density of distribution of the plurality of first patterns within the first region is the same as a density of distribution of the plurality of first patterns within the second region, the second replicate mold comprises at least one second pattern, and the second pattern corresponds to at least one of the plurality of first patterns;
    providing a first substrate, and a first polymeric compound layer being coated on the first substrate;
    performing a first nanoimprint process to nanoimprint the plurality of first patterns into the first polymeric compound layer;
    after the first nanoimprint process, performing a first etching process to etch the first substrate to form a plurality of protruding features by taking the first polymeric compound layer as a first mask;
    after the first etching process, completely removing the first polymeric compound layer before forming a second polymeric compound layer coated on the first substrate;
    performing a second nanoimprint process to nanoimprint the second pattern into the second polymeric compound layer; and
    after the second nanoimprint process, performing a second etching process to completely remove at least one of the plurality of protruding features by taking the second polymeric compound layer as a second mask, wherein during the second etching process at least another one of the plurality of protruding features is not etched.

2. The method of forming patterns on a substrate by double nanoimprint processes of claim 1, wherein the first substrate is etched to form a plurality of third patterns during the second nanoimprint process, a density of distribution of the plurality of third patterns is not uniform, and the first substrate is defined into a high density region and a low density region based on numbers of the plurality of third patterns.

3. The method of forming patterns on a substrate by double nanoimprint processes of claim 2, wherein the second pattern on the second replicate mold corresponds to the low density region of the first substrate.

4. The method of forming patterns on a substrate by double nanoimprint processes of claim 1, further comprising:
    before providing the first replicate mold and the second replicate mold, providing a first mold and a second mold, wherein the first mold comprises a plurality of fourth patterns, the second mold comprises at least one fifth pattern, and the fifth pattern corresponds to one of the plurality of fourth patterns; and
    imprinting the plurality of fourth patterns into the first replicate mold to form the plurality of first patterns, imprinting the fifth pattern into the second replicate mold to form the second pattern, wherein the plurality of first patterns can engage to the plurality of fourth patterns, and the second pattern can engage to the fifth pattern.

5. The method of forming patterns on a substrate by double nanoimprint processes of claim 4, wherein a plurality of seventh patterns in the first polymeric compound layer are formed by imprinting the plurality of first patterns on the first replicate mold into the first polymeric compound layer, and a size of each of the plurality of seventh patterns is the same of a size of each of the plurality of fourth patterns.

6. The method of forming patterns on a substrate by double nanoimprint processes of claim 4, wherein at least one eighth pattern is formed in the second polymeric compound layer by imprinting the second pattern on the second replicate mold into the second polymeric compound layer, and a size of the eighth pattern is the same of a size of the fifth pattern.

7. The method of forming patterns on a substrate by double nanoimprint processes of claim 4, wherein steps of forming the first mold comprises:
    providing a second substrate;
    forming a plurality of sixth patterns on the second substrate, wherein a density of distribution of the plurality of sixth patterns is not uniform;
    forming at least one balance pattern within a region where the density of distribution of the plurality of sixth patterns is lower comparing to other regions on the second substrate; and
    etching the second substrate to form the first mold by taking the plurality of sixth patterns and the balance pattern as a third mask.

8. The method of forming patterns on a substrate by double nanoimprint processes of claim 4, wherein the plurality of fourth patterns on the first mold are nanoimprinted to the first replicate mold and the fifth pattern on the second mold is nanoimprinted to the second replicate mold.

9. The method of forming patterns on a substrate by double nanoimprint processes of claim 1, further comprising:
    after the first etching process and before forming the second polymeric compound layer, removing the first polymeric compound layer.

10. The method of forming patterns on a substrate by double nanoimprint processes of claim 1, further comprising:
    after the second etching process, removing the second polymeric compound layer.

11. The method of forming patterns on a substrate by double nanoimprint processes of claim 1, wherein the first nanoimprint process comprises:
    pressing the first replicate mold to the first polymeric compound layer to make the first polymeric compound layer fill up between the first replicate mold and the first substrate;
    hardening the first polymeric compound layer, wherein the first polymeric compound layer which is hardened comprises a plurality of seventh patterns and a residual layer, and the plurality of seventh patterns are disposed on the residual layer; and
    removing the first replicate mold.

12. The method of forming patterns on a substrate by double nanoimprint processes of claim 11, wherein a thickness of the residual layer is uniform.

* * * * *